United States Patent [19]

Stannek

[11] Patent Number: 4,819,326

[45] Date of Patent: Apr. 11, 1989

[54] METHOD FOR ROBOTIC PLACEMENT OF ELECTRONIC PARTS ON A CIRCUIT BOARD

[76] Inventor: Karl H. Stannek, 20122 Kline Dr., Santa Ana Heights, Calif. 92707

[21] Appl. No.: 207,197

[22] Filed: Jun. 16, 1988

[51] Int. Cl.⁴ ............................................... H05K 3/30
[52] U.S. Cl. ........................................ 29/837; 29/741; 29/809
[58] Field of Search ................. 29/837, 838, 839, 809, 29/810, 741

[56] References Cited

U.S. PATENT DOCUMENTS 4,077,557  3/1978  Merritt .............................. 29/741 X
4,212,102  7/1980  Drinkard, Jr. ......................... 29/741
4,598,456  7/1986  McConnell ....................... 29/741 X Primary Examiner—Timothy V. Eley
Attorney, Agent, or Firm—William H. Drummond

[57] ABSTRACT

An improved method for robotic placement of electronic parts having depending electrical leads on a circuit board. A part is selectively abstracted from a supply in which the parts are arranged with the leads pointing upwardly, and the part is re-oriented during movement to the circuit board such that the leads are pointing downwardly when the part is emplaced on the circuit board with the leads extending through pre-drilled holes in the board.

1 Claim, 4 Drawing Sheets

METHOD FOR ROBOTIC PLACEMENT OF ELECTRONIC PARTS ON A CIRCUIT BOARD

This invention relates to a method for robotic placement of electronic parts on a circuit board.

More particularly, the invention concerns a method which is specially adapted to cyclical placement of parts having depending electrical leads from a supply thereof to preselected locations on a circuit board having pre-drilled holes to accept such leads.

In still another and more particular respect, the invention pertains to such a method which can be practiced by the use of robotic machinery of simplified construction.

Even more specifically, the invention relates to such a method in which the cycles can be repeated more accurately and in a shorter period of time.

In the mass production of electronic circuit boards, it is commonly required that various electronic parts, e.g., pin headers, integrated circuits and the like, which have depending electrical leads, be placed with great accuracy and at high speed at preselected locations on a circuit board substrate. The circuit board has holes which are pre-drilled to receive the depending electrical leads therethrough. After the part is emplaced with the leads extending through the pre-drilled holes in the circuit board, various further operations, e.g., soldering, are then performed in the production process.

Present robotic technology for carrying out the placement of such parts on the circuit board substrate typically involves selectively abstracting a part from a supply thereof in which the parts are fed from the supply to a robotic gripper with the electrical leads depending from the part pointing downwardly. Thus, according to the prior art, when the part is abstracted from the supply, the part and its depending leads are oriented generally in the same position as the part will assume when it is emplaced on the circuit board.

This prior art method suffers several disadvantages. First, it is often difficult to arrange a plurality of these parts in a supply with the leads pointing downwardly, owing to the peculiar geometry of the parts. For example, in the case of pin headers, the normally upwardly extending pins are longer and, consequently, heavier than the shorter depending electrical leads. This tends to unbalance parts which are arranged in a supply and fed by gravity or a vibrating device to the part-abstracting location. Secondly, it is necessary to grip the edges of parts which are fed to the robotic gripper in the same orientation as they will be emplaced, increasing the mechanical complexity of the robotic apparatus and the time required for completion of each cycle thereof.

Accordingly, it is the principal object of the invention to provide an improved method for placement of electronic parts having depending electrical leads on circuit board substrates.

Yet another object of the invention is to provide such an improved method which performs the part abstracting and placement sequence in a shorter period of time and with less complex robotic machinery.

Still another object of the invention is to provide such a method which enables the use of machinery and assembly techniques which more accurately place the part at a preselected location on the circuit board substrate.

These and other, further and more specific objects and advantages of the invention will be apparent to those skilled in the art from the following detailed description thereof, taken in conjunction with the drawings, in which.

Figure 1:
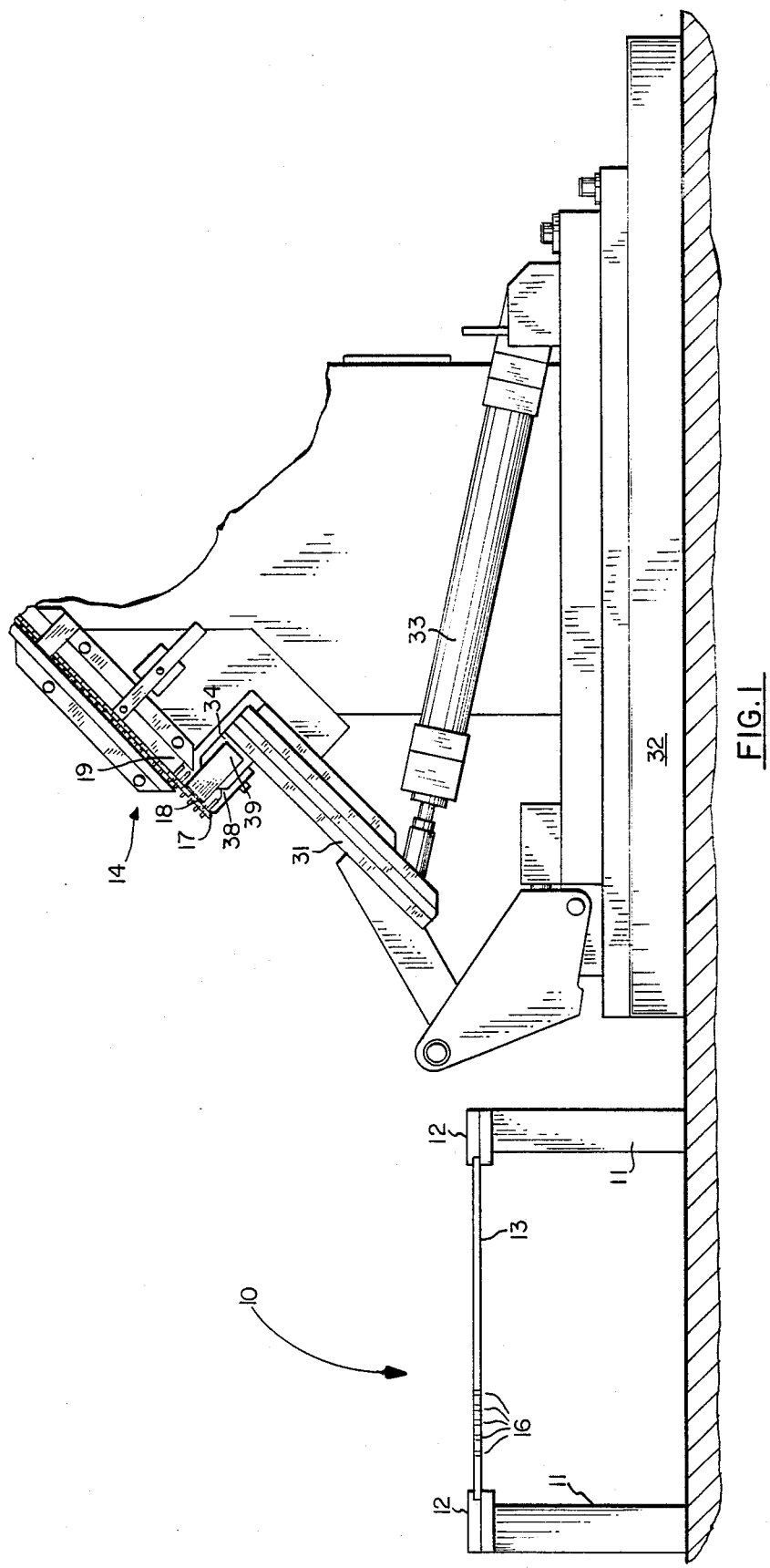
FIG. 1 is an elevation view showing one form of apparatus which is adapted for the practice of the method of the invention, with the robotic arm shown in the part abstracting position.
Figure 2:
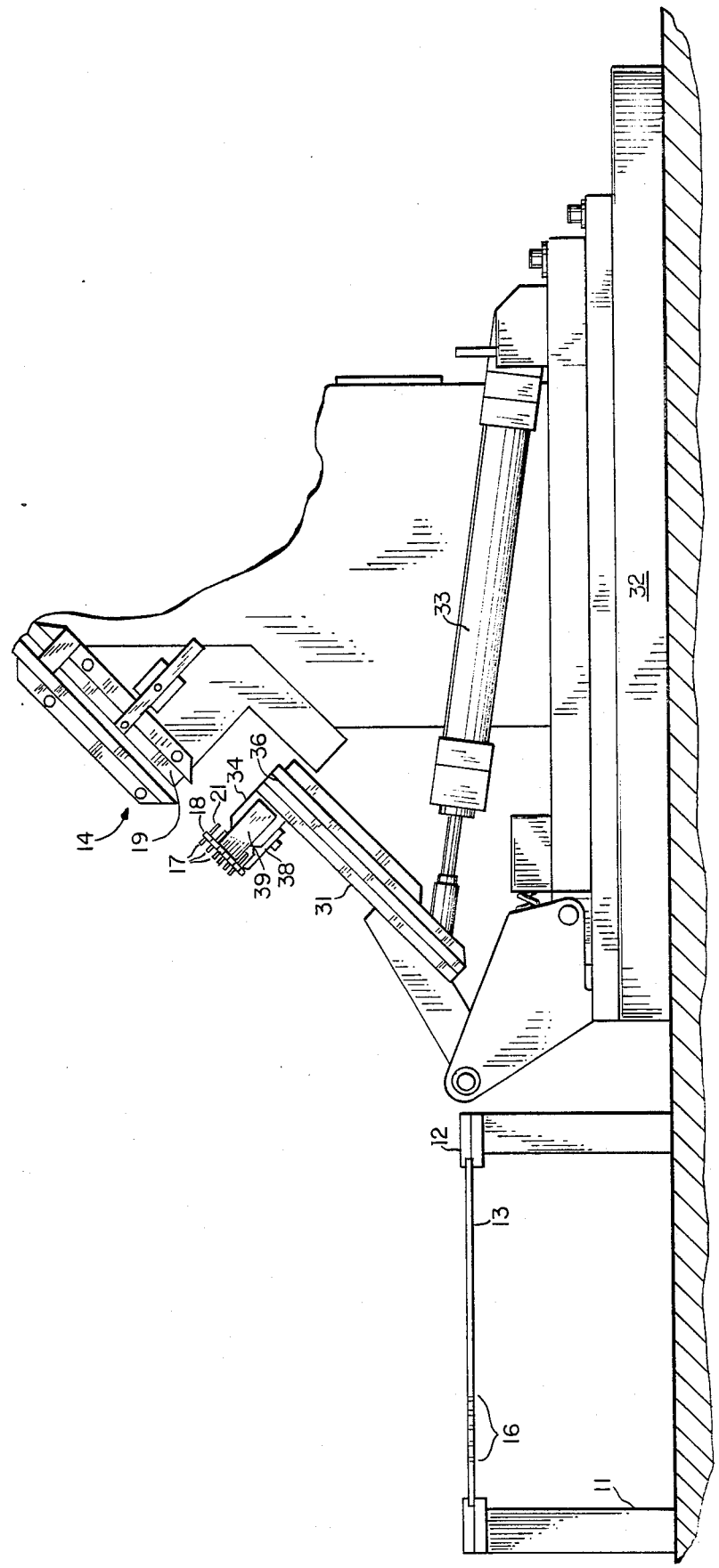
FIG. 2 depicts the apparatus of FIG. 1, showing the orientation of the robotic arm after the part is abstracted from the supply and prior to the commencement of the part movement and placement steps.

Briefly, in accordance with the invention, I provide improvements in the prior art methods for robotic placement of parts having depending electrical leads on a circuit board. Such methods generally involve the placement of the part such that the electrical leads of the part are received through pre-drilled holes in the circuit board substrate. In this prior art, cyclical method, one of the parts is selectively abstracted from a supply thereof by a robotic arm, the terminal end of which is adapted to selectively engage and temporarily hold the part. The robotic arm is then mechanically actuated to move the abstracted part from the supply and place the part on the circuit board with the electrical leads extending through pre-drilled holes in the circuit board substrate.

According to the improved method of the invention, parts are arranged in a supply with the electrical leads thereof extending upwardly and after a part is abstracted from the part supply with the leads thus oriented, the part is re-oriented with or without rotating during the movement thereof from the supply to the circuit board such that the leads extend downwardly when the part is emplaced on the circuit board.

In accordance with the presently preferred embodiment of the invention, the steps of the improved method are carried out by simply feeding the parts to the robotic arm, with the leads pointing upwardly, and, once the part is abstracted, simply causing the tip of the robotic arm, carrying the abstracted part, to move in a vertical plane until the part leads extend downwardly to register with the pre-drilled holes in the circuit board substrate. It is to be emphasized, however, that the precise details of how this re-orientation is accomplished are not critical and that, considered in its broadest aspects, the invention embodies the concept of the re-orientation step in which the direction of the leads of the part is changed from generally upwardly to generally downwardly.

Turning now to the drawings, in which like reference characters identify the same parts in the several views, FIGS. 1-5 illustrate a form of apparatus which can be conveniently used to practice the method of the invention. It will be understood by those skilled in the art, however, that the mechanical details of such apparatus can be varied considerably without departing from the scope of the invention which is defined only by the appended claim.

As depicted in FIG. 1, an assembly-line conveyor, generally indicated by reference numeral 10, is provided consisting of spaced vertical supports 11 having slotted runners 12 which provide for moving a pre-drilled circuit board 13 along the assembly line. When the board 13 reaches a work station opposite the part placing mechanism, generally indicated by reference numeral 14, movement of the board 13 along the assembly line 10 is temporarily halted and the board is indexed to an exact part-receiving location. As previously indicated, the board is provided with pre-drilled holes 16, which are spaced to precisely receive electrical leads 17 of an electrical part, illustratively a pin header 18.

Figure 3:
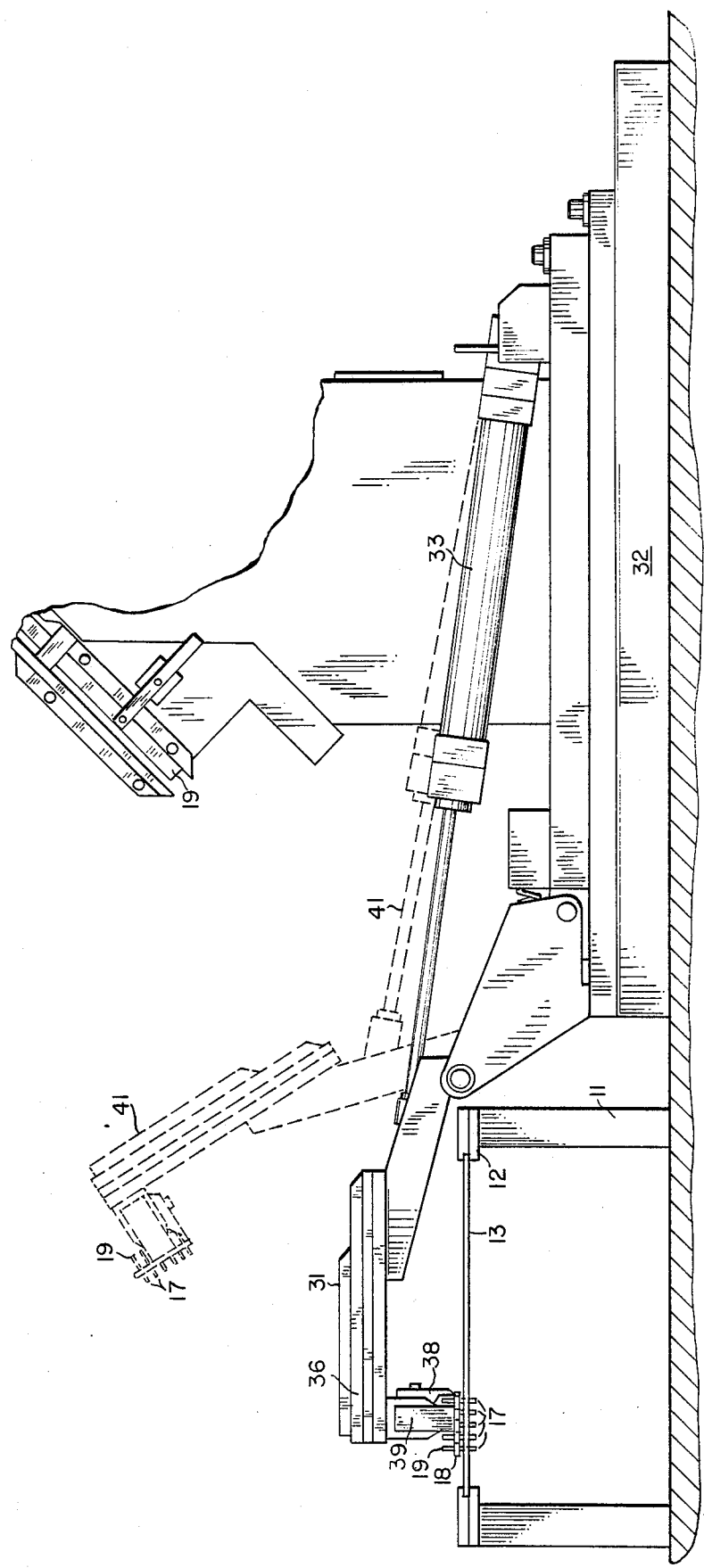
FIG. 3 depicts the apparatus of FIGS. 1-2 with the movement of the robotic arm from the part abstracting to the placement position depicted, using dashed lines to show the orientation of the part during the movement from the supply to the circuit board location.
Figure 4:
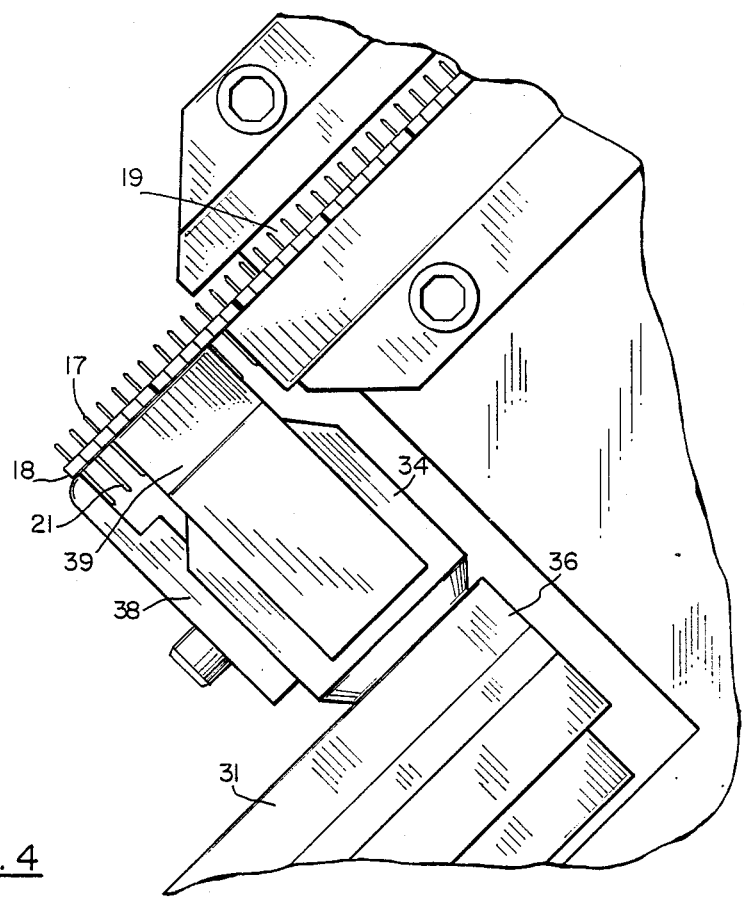
FIG. 4 shows in greater detail the orientation of the robotic arm during the part-abstracting step.

Also, referring to FIG. 4, it will be observed that a supply of the parts 18 is provided by sequentially stacking a plurality of these parts along a slotted guide 19 with the pin leads 21 of the pin header 18 extending downwardly on either side of the channel 19 and the electrical leads 17 of the pin header 18 extending upwardly, as particularly shown in FIGS. 1 and 4. A robotic arm 31 pivotally carried on a base 32, actuated, for example, by a hydraulic cylinder-piston mechanism 33 carries a part gripper 34 on its terminal end 36. The mechanical details of the part gripper 34 can vary widely depending on the exact nature of the particular electronic part being emplaced on the circuit board 13. For example, as shown in the drawings, the gripper 34 for pin header 18 simply consists of a slotted channel member 37 provided with an adjustable stop member 38 which positions the pin header 18 axially along the slotted channel 37 and hydraulically actuated movable side walls 39, which move inwardly in the direction of the arrows A to frictionally grip the pin leads 21 of the pin header 18 during the movement of the part 18 from the supply channel 19 (as shown in FIG. 4) to the final placement position (as shown in FIG. 3).

As will be noted, in the supply and part-abstracting position, as shown in FIG. 4, the part 18 is oriented such that the electrical leads 17 (i.e., those leads which will be received in the pre-drilled holes 16 of the circuit board 13) are oriented to point upwardly. This orientation results in the part 18 being retained in stable equilibrium by gravity upon the supply slide 19 with the heavier and longer portions of the part 18, i.e., the longer pin leads 19, depending downwardly. However, in accordance with the method of the invention, during movement of the part 18 from the supply channel 19 to the final placement location, as more clearly depicted in FIG. 3, the orientation of the pin leads 17 is changed to extend downwardly during the movement of the part to the placement location on the circuit board 13. As depicted in FIG. 3, this reorientation is accomplished by simply moving the robotic arm 31 through an arc in the vertical plane, as indicated by the dashed lines 41. Those skilled in the art will understand and appreciate that such reorientation could, however, be accomplished with a wide variety of different mechanical movements. In broadest concept, however, it will be appreciated that the invention resides in the reorientation step without regard to the specific means by which it is accomplished.

Figure 5:
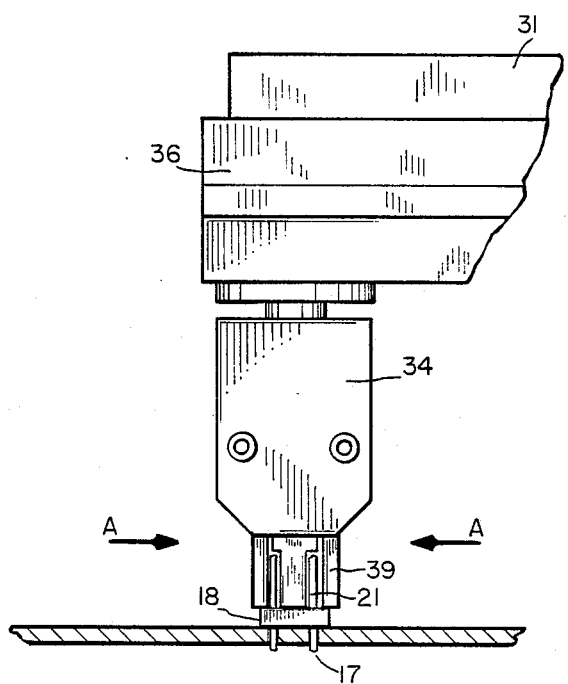
FIG. 5 depicts an optional step in which the part is rotated in its own plane to permit placement in an alternative orientation on the circuit board substrate, i.e., transverse to the position shown in FIG. 3.

Further embellishments of this concept will readily occur to those skilled in the art. For example, as illustrated in FIG. 5, the robotic arm 36 can be provided with suitable mechanisms to rotate the gripper 34 during the reorientation step to also rotate the part in its own plane and emplace it in a position rotated from the position shown in FIGS. 1-4.

Having described my invention in such terms as to enable those skilled in the art to understand and practice it and having described the presently preferred embodiment thereof, I claim:

1. In a method for robotic placement of parts having depending electrical leads on a circuit board having pre-drilled holes to receive said leads therethrough, said method including a cycle comprising selectively abstracting one of said parts from a supply thereof by a robotic arm, the terminal end of which is adapted to selectively engage and temporarily hold said part, mechanically actuating said robotic arm to move said abstracted part from said supply and emplace said part on said circuit board with said leads extending through said pre-drilled holes, and releasing said emplaced part and repeating said cycle, the improvement in said method comprising the steps of arranging said parts in said supply so that said leads extend upwardly, and re-orienting said part during movement thereof from said supply to said circuit board, such that said leads extend downwardly when said part is emplaced on said circuit board.

* * * * *